United States Patent
Oh et al.

(10) Patent No.: US 7,361,521 B2
(45) Date of Patent: Apr. 22, 2008

(54) METHOD OF MANUFACTURING VERTICAL GAN-BASED LIGHT EMITTING DIODE

(75) Inventors: Jeong Tak Oh, Suwon (KR); Jae Hoon Lee, Suwon (KR); Seok Beom Choi, Daejeon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 11/503,944

(22) Filed: Aug. 15, 2006

(65) Prior Publication Data

US 2007/0042520 A1  Feb. 22, 2007

(30) Foreign Application Priority Data

Aug. 17, 2005 (KR) .................. 10-2005-0075159

(51) Int. Cl.
*H01L 21/00* (2006.01)
(52) U.S. Cl. ........................ 438/46; 257/200
(58) Field of Classification Search ........ 257/E31.099, 257/E31.105, E25.032, 88; 438/60, 67, 69, 438/46
See application file for complete search history.

(56) References Cited

U.S. PATENT DOCUMENTS

2007/0082486 A1* 4/2007 Yang et al. ................. 438/666

FOREIGN PATENT DOCUMENTS

JP          2005-4110       2/2005
JP     10-2005-0060740      6/2005

* cited by examiner

*Primary Examiner*—Kiesha L. Rose
*Assistant Examiner*—Kimberly Trice
(74) *Attorney, Agent, or Firm*—McDermott Will & Emery LLP

(57) ABSTRACT

The present invention relates to a method of manufacturing a vertical GaN-based LED. The method includes forming an insulating pattern on a substrate to define LED regions having a predetermined size; sequentially stacking an n-type GaN-based semiconductor layer, an active layer, and a p-type GaN-based semiconductor layer on the substrate except for the insulating pattern to form a light emitting structure; removing the insulating pattern to divide the light emitting structure into LED sections having a predetermined size; forming p-electrodes on the LED sections, respectively; forming a structure support layer on the p-electrodes; removing the substrate to expose the divided n-type GaN-based semiconductor layer; and forming n-electrodes on the exposed n-type GaN-based semiconductor layer.

8 Claims, 3 Drawing Sheets

[FIG. 1A]
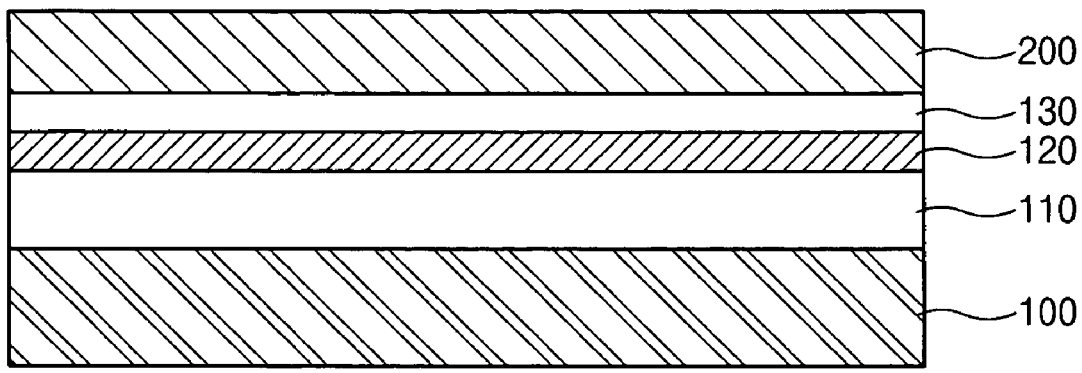
[FIG. 1B]
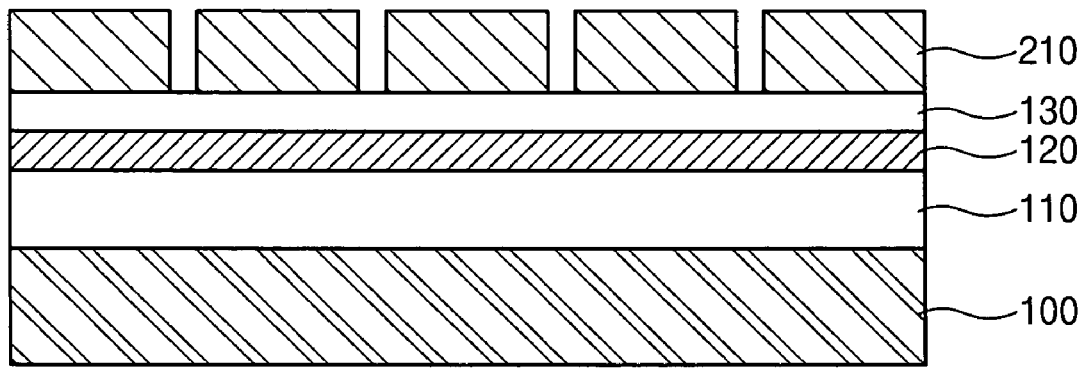
[FIG. 1C]
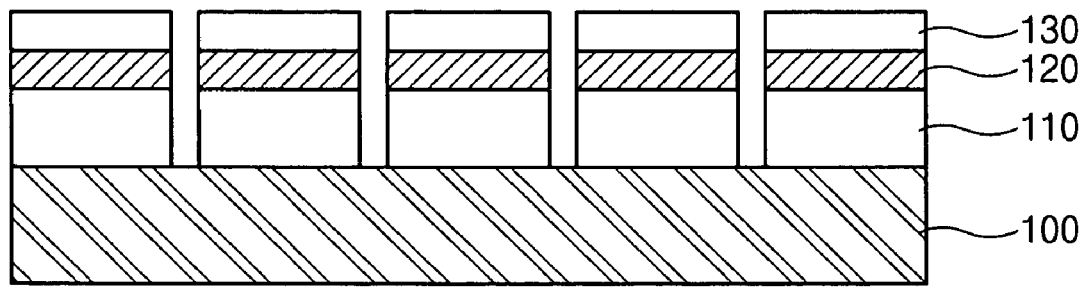
[FIG. 1D]
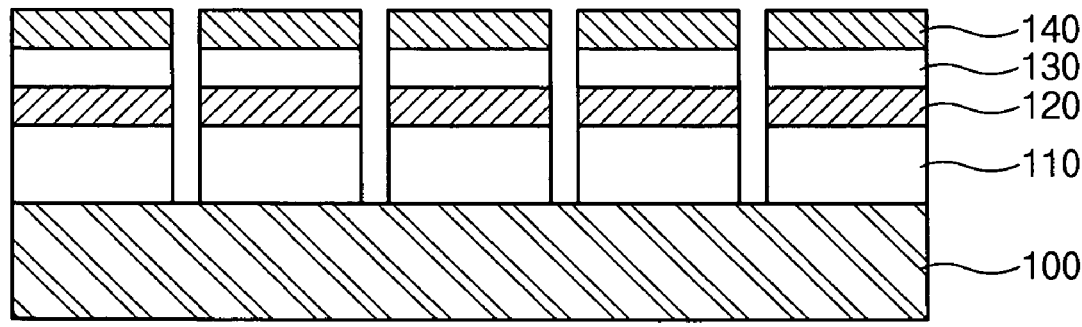

[FIG. 1E]
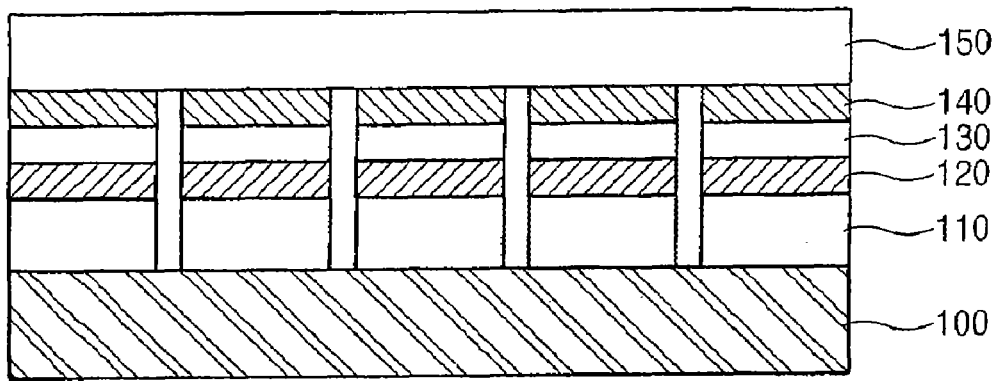
[FIG. 1F]
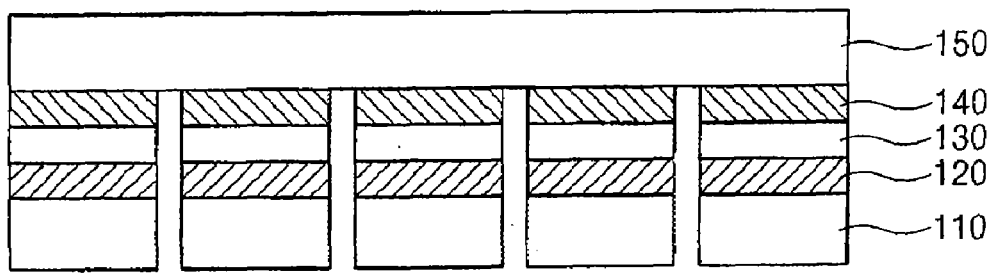
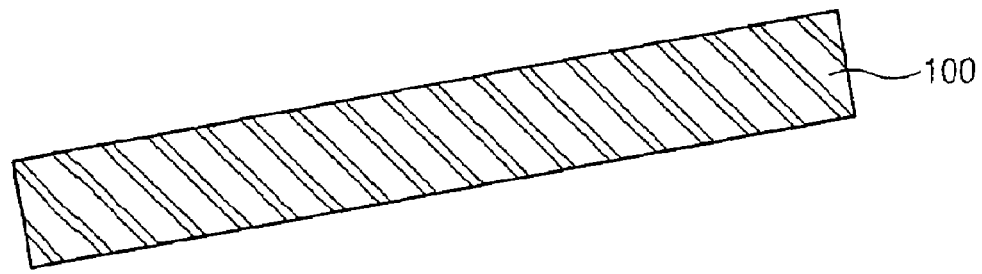
[FIG. 2A]
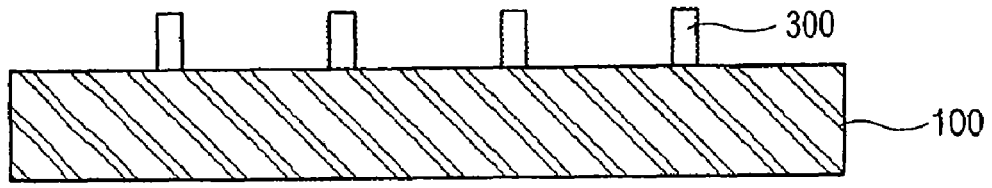
[FIG. 2B]
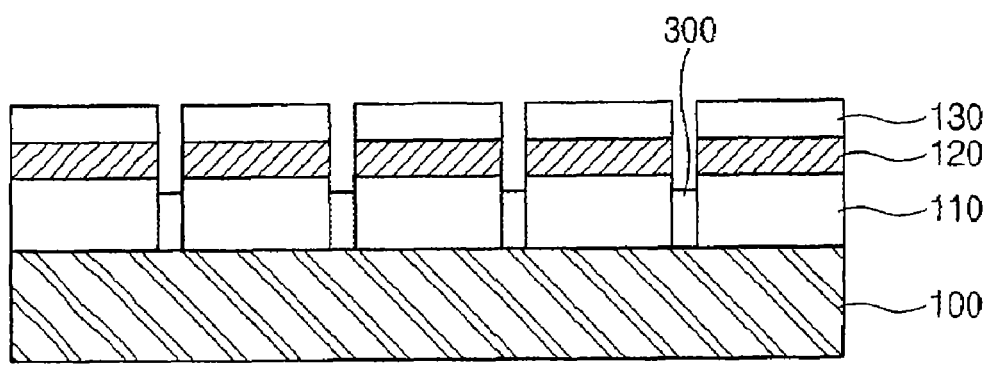

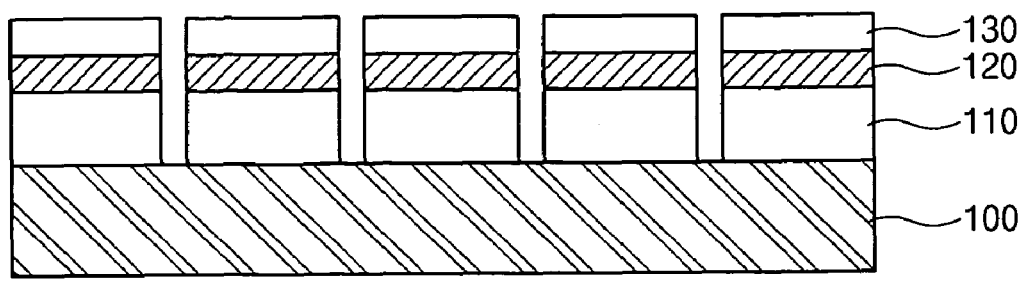
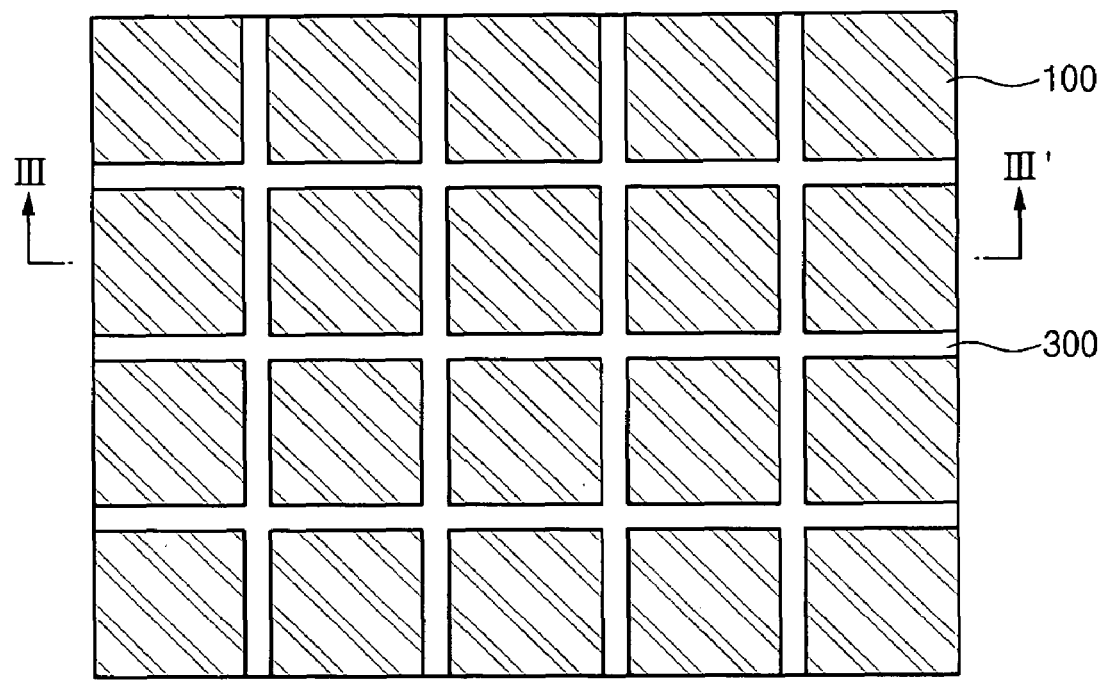

METHOD OF MANUFACTURING VERTICAL GAN-BASED LIGHT EMITTING DIODE

CROSS-REFERENCE TO RELATED APPLICATIONS

This application claims the benefit of Korean Patent Application No. 2005-0075159 filed with the Korea Industrial Property Office on Aug. 17, 2005, the disclosure of which is incorporated herein by reference.

BACKGROUND OF THE INVENTION

1. Field of the Invention

The present invention relates to a method of manufacturing a vertical (vertical electrode type) GaN-based light emitting diode (LED). In the vertical GaN-based LED, a light emitting structure having a GaN layer and an active layer can be divided into LEDs without damage.

2. Description of the Related Art

Generally, GaN-based LEDs are formed by growing a light emitting structure on a sapphire substrate. However, because a sapphire substrate is rigid and electrically non-conductive and has a low thermal conductivity, it is difficult to reduce the size of the GaN-based LED for cost-down or improve the optical power and chip characteristics. Particularly, heat dissipation is very important for the LEDs because a large current should be applied to the GaN-based LEDs so as to increase the optical power of the GaN-based LEDs.

To solve these problems, a vertical GaN-based LED has been proposed. The vertical GaN-based LED is obtained by removing the sapphire substrate from the general GaN-based LED by a laser lift-off (hereinafter, referred to as LLO) technology.

The conventional vertical LED will be described in detail with reference to FIGS. 1A to 1F.

FIGS. 1A to 1F are sectional views illustrating a method of manufacturing a conventional vertical GaN-based LED.

Referring to FIG. 1A, a light emitting structure 160 including GaN-based semiconductor layers is formed on a transparent substrate 100 such as a sapphire substrate. The light emitting structure 160 includes an n-type GaN-based semiconductor layer 110, a GaN/InGaN active layer 120 having a multi-quantum well structure, and a p-type GaN-based semiconductor layer 130.

Referring to FIG. 1B, a photosensitive layer pattern 210 is formed on the p-type GaN-based semiconductor layer 130 to define LED regions having a desired size.

Referring to FIG. 1C, the light emitting structure 160 is divided into equal sections with the size of LEDs by dry etching (e.g., inductive coupled plasma (ICP) dry etching) using the photoconductive layer pattern 210 as an etch mask.

To divide the light emitting structure 160, the light emitting structure 160 is dry etched until the substrate 100 on which the light emitting structure 100 is formed is exposed. In this case, however, the n-type GaN-based semiconductor layer 110, the active layer 120, and the p-type GaN-based semiconductor layer 130 of the light emitting structure 160 can be cracked or damaged because they are exposed to the plasma for a long time. Thus, the characteristics of the LED can be deteriorated.

Referring to FIG. 1D, positive electrodes (p-electrodes) 140 are formed on the sections of the light emitting structure 160, respectively. Next, referring to FIG. 1E, a structure support layer 150 is formed on the p-electrodes 140.

Referring to FIG. 1F, the substrate 100 is removed by an LLO process. Then, negative electrodes (n-electrodes) (not shown) are formed on the exposed N-type GaN-based semiconductor layer 110. In this way, a vertical GaN-based LED is formed.

As described above, when the vertical GaN-based LED is formed by the related art method, the characteristics and reliability of the vertical GaN-based LED are deteriorated due to the above-described problems. Consequently, the process yield of the LED is reduced.

SUMMARY OF THE INVENTION

An advantage of the present invention is that it provides a method of manufacturing a vertical GaN-based LED in which a light emitting structure having a GaN layer and an active layer can be divided into LEDs without damage, such that device yield as well as the characteristics and reliability of the LED can be improved.

Additional aspects and advantages of the present general inventive concept will be set forth in part in the description which follows and, in part, will be obvious from the description, or may be learned by practice of the general inventive concept.

According to an aspect of the invention, there is provided a method of manufacturing a vertical GaN-based LED (light emitting diode) device. The method includes: forming an insulating pattern on a substrate to define LED regions having a predetermined size; sequentially stacking an n-type GaN-based semiconductor layer, an active layer, and a p-type GaN-based semiconductor layer on the substrate except for the insulating pattern to form a light emitting structure; removing the insulating pattern to divide the light emitting structure into LED sections having a predetermined size; forming p-electrodes on the LED sections, respectively; forming a structure support layer on the p-electrodes; removing the substrate to expose the divided n-type GaN-based semiconductor layer; and forming n-electrodes on the exposed n-type GaN-based semiconductor layer.

According to another aspect of the invention, the insulating pattern is formed of silicon oxide or nitride oxide. Therefore, when the light emitting structure is formed on the substrate, the light emitting structure is not formed in regions of the substrate covered with the insulating pattern, such that the light emitting structure can be divided into the LED sections without an additional separating process.

According to a further aspect of the present invention, the removing of the insulating pattern is performed by wet etching.

According to a still further aspect of the present invention, the insulating pattern is lower than the n-type GaN-based semiconductor layer. The insulating pattern may have a height of about 200 nm to 1000 nm.

According to a still further aspect of the present invention, the insulating pattern has a width equal to or smaller than a length and a width of the light emitting structure divided into the LED sections. The reason for this is that the mass productivity of the LED lowers when the insulating pattern has a width larger than the length and width of the ling emitting structure According to a still further aspect of the present invention, the light emitting structure is formed by sequentially growing the n-type GaN-based semiconductor layer, the active layer, and the p-type GaN-based semiconductor layer in a MOCVD (metal organic chemical vapor deposition) reactor.

According to a still further aspect of the present invention, the method further includes forming a conductive bonding layer on the p-type GaN-based electrodes prior to the forming of the structure support layer. The conductive bonding layer increases the bonding strength between the p-electrodes and the structure support layer.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 1A to 1F are sectional views illustrating a method of manufacturing a vertical GaN-based LED according to the related art;

FIGS. 2A to 2C are sectional views illustrating a method of manufacturing a vertical GaN-based LED according to an embodiment of the present invention; and FIG. 3 is a plan view of the vertical GaN-based LED illustrated in FIG. 2A.

DETAILED DESCRIPTION OF THE PREFERRED EMBODIMENTS

Reference will now be made in detail to the embodiments of the present general inventive concept, examples of which are illustrated in the accompanying drawings. The embodiments are described below in order to explain the present general inventive concept by referring to the figures.

In the drawings, like reference numerals refer to the like elements throughout, and the thicknesses of layers and regions are exaggerated for clarity.

Hereinafter, a method of manufacturing a vertical GaN-based LED according to the embodiments of the present invention will be described in detail with reference to the accompanying drawings.

First, the method of manufacturing the vertical GaN-base LED according to an embodiment of the present invention will be described below in detail with reference to FIGS. 2A to 2C in conjunction with FIGS. 1D to 1F described above;

FIGS. 2A to 2C are sectional views illustrating the method of manufacturing the vertical GaN-based LED according to an embodiment of the present invention.

Referring to FIG. 2A, an insulating pattern 300 is formed on a substrate 100 to define LED regions having a predetermined size. Preferably, the substrate 100 is formed of a transparent material including sapphire. Alternatively, the substrate 100 can be formed of a transparent material including zinc oxide (ZnO), gallium nitride (GaN), silicon carbide (SiC), or aluminum nitride (AlN).

As illustrated in FIG. 3, the insulating pattern 300 exposes regions of the substrate 100 on which LEDs will be formed and covers the other regions of the substrate 100. Therefore, when nitride semiconductor layers are grown on the substrate 100 to form a light emitting structure 160 (see FIG. 2B), the light emitting structure 160 can be divided into LED sections having a predetermined size without an additional cutting operation owing to the insulating pattern 300 because the nitride semiconductor layers are grown only on the regions of the substrate 100 exposed by the insulating pattern 300 but are not grown on the other regions of the substrate 100 covered with the insulating pattern 300. Preferably, the insulating pattern 300 is formed of silicon oxide such as $SiO_2$ or silicon nitride ($Si_xN_y$).

FIG. 3 is a plan view for explaining the GaN-based LED of FIG. 2A more fully. FIG. 2A is a sectional view taken along ling III-III' of FIG. 3.

Particularly, the insulating pattern 300 is lower than an n-type GaN-based semiconductor layer 110 (see FIG. 2B) to be formed in the next operation. Therefore, in the next operation, the sidewall of the light emitting structure 160 including the n-type GaN-based semiconductor layer 110 can be formed at a right angle or an inclined angle to the substrate 100 depending on the characteristics of the LED. In the current embodiment, the insulating pattern 300 has a height of about 200 nm to 1000 nm.

Meanwhile, the angle between the sidewall of the light emitting structure 160 and the substrate 100 is determined by process conditions and characteristics, such as the temperature and pressure for growing the light emitting structure 160, and by the group V/III composition ratios of nitride semiconductor layers of the light emitting structure 160. Preferably, the angle between the light emitting structure 160 and the substrate 100 is adjusted based on the sizes of LEDs and the insulating pattern 300.

Referring to FIG. 2B, the light emitting structure 160 including nitride semiconductor layers is formed on the substrate 100 where the insulating pattern 300 is formed. The light emitting structure 160 is formed by sequentially stacking the nitride semiconductor layers. The nitride semiconductor layers include the n-type GaN-based semiconductor layer 110, a GaN/InGaN active layer 120 having a quantum well structure, and a p-type GaN-based semiconductor layer 130.

The n-type and p-type GaN-based semiconductor layers 110 and 130 and the active layer 120 may be formed of a GaN-based semiconductor material including $Al_xIn_yGa_{(1-x-y)}N$ ($0 \leq x \leq 1$, $0 \leq y \leq 1$, $0 \leq x+y \leq 1$) through a well-known nitride deposition process such as metal organic chemical vapor deposition (MOCVD).

Meanwhile, the active layer 120 may be formed into a single quantum well layer structure or a double heterostructure. The amount of indium (In) included in the active layer 120 determines whether the LED will be a green LED or a blue LED. For example, when the active layer 120 includes about 22-% indium (In), the LED emits blue light, and when the active layer 120 includes about 40-% indium (In), the LED emits green light. That is, the amount of indium (In) included in the active layer 120 varies depending on the required light wavelength.

Thus, as explained above, the active layer 120 has a great effect on the characteristics and reliability of the GaN-based LED. Therefore, the active layer 120 must be formed without failure such as crack or penetration of external conductive materials during the overall manufacturing process of the LED.

Referring to FIG. 2C, the light emitting structure is divided into LED sections having a predetermined size by removing the insulating pattern 300. The insulating pattern 300 is removed by wet etching.

That is, according to the present invention, the insulating pattern 300 is formed on the substrate 100 to define LED regions, the light emitting structure 160 is formed in the LED regions, and the insulating pattern 300 is removed. Therefore, an additional separation process such as ICP etching or reactive ion etching (RIE) is not required for dividing the light emitting structure 160 into LED sections. Therefore, the LED according to the present invention can be formed by a simpler process without failures such as cracks in the LED sections and penetration of external conductive materials into the LED sections, which occur during ICP etching or RIE.

Particularly, the p-type GaN-based semiconductor layer 130 and the active layer 120 do not have surface failures such as cracks caused by a long-time exposure to plasma during ICP etching or RIE.

As illustrated in FIG. 1D, p-electrodes 140 are formed on the respective LED sections of the light emitting structure 160 (i.e., on the respective sections of the p-type GaN-based semiconductor layer 130) that are divided after the insulating pattern 300 is removed.

In this embodiment, the p-electrodes 140 are formed on the p-type GaN-based semiconductor layers 130 after the insulating pattern 300 is removed; however, the characteristics and reliability of the LED are not affected when the p-electrodes 140 are formed before the insulating pattern 300 is removed. That is, the p-electrodes 140 can be formed at any process stage depending on process conditions.

Referring to FIG. 1E, a structure support layer 150 is formed on the p-electrodes 140. Meanwhile, a conductive bonding layer (not shown) can be additionally formed between the p-electrodes 140 and the structure support layer 150 for more securable bonding between the p-electrodes 140 and the structure support layer 150.

Referring to FIG. 1F, the substrate 100 is removed by an LLO process.

Then, a commonly used electrode forming operation is performed to form n-electrodes (not shown) on the respective n-type GaN-based semiconductor layers 110 that are exposed after the substrate 100 is removed. In this way, the GaN-based LED is formed.

As described above, when the light emitting structure is divided into LED sections, ICP etching or RIE is not used. Instead, the light emitting structure is formed in LED regions of the substrate defined by the insulating pattern, and then the insulating pattern is removed by wet etching to divide the light emitting structure into the LED sections. Therefore, the light emitting structure (the LED sections) having the GaN-based semiconductor layers and the active layer can be prevented from damages or short-circuits caused by surface failures or penetration of external conductive materials.

Further, the vertical GaN-based LED can be formed by a simpler process because ICP etching or RIE is not used.

Therefore, according to the present invention, the vertical GaN-based LED can have improved characteristics and reliability. In addition, the LED can be manufactured with improved yield.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a vertical GaN-based LED (light emitting diode) device, the method comprising:
    forming an insulating pattern on a substrate to define LED regions having a predetermined size;
    sequentially stacking an n-type GaN-based semiconductor layer, an active layer, and a p-type GaN-based semiconductor layer on the substrate except for the insulating pattern to form a light emitting structure;
    removing the insulating pattern to divide the light emitting structure into LED sections having a predetermined size;
    forming p-electrodes on the LED sections, respectively;
    forming a structure support layer on the p-electrodes;
    removing the substrate to expose the n-type GaN-based semiconductor layer; and
    forming n-electrodes on the exposed n-type GaN-based semiconductor layer.

2. The method according to claim 1,
    wherein the insulating pattern is formed of silicon oxide or nitride oxide.

3. The method according to claim 1,
    wherein the removing of the insulating pattern is performed by wet etching.

4. The method according to claim 1,
    wherein the insulating pattern is lower than the n-type GaN-based semiconductor layer.

5. The method according to claim 4,
    wherein the insulating pattern has a height of about 200 nm to 1000 nm.

6. The method according to claim 1,
    wherein the insulating pattern has a width equal to or smaller than a length and a width of the light emitting structure divided into the LED sections.

7. The method according to claim 1,
    wherein the light emitting structure is formed by sequentially growing the n-type GaN-based semiconductor layer, the active layer, and the p-type GaN-based semiconductor layer in a MOCVD (metal organic chemical vapor deposition) reactor.

8. The method according to claim 1,
    further comprising forming a conductive bonding layer on the p-type GaN-based electrodes prior to the forming of the structure support layer.

* * * * *